(12) United States Patent
Kwon et al.

(10) Patent No.: US 7,282,836 B2
(45) Date of Patent: Oct. 16, 2007

(54) METHOD AND APPARATUS FOR A D33 MODE PIEZOELECTRIC ACTUATOR WITH A BENDING MOTION

(75) Inventors: Haesung Kwon, San Jose, CA (US); Hyung Jai Lee, Cupertino, CA (US)

(73) Assignee: Samsung Electronics Co., Ltd., Suwon (KR)

( * ) Notice: Subject to any disclaimer, the term of this patent is extended or adjusted under 35 U.S.C. 154(b) by 40 days.

(21) Appl. No.: 11/298,721

(22) Filed: Dec. 8, 2005

(65) Prior Publication Data

US 2007/0132343 A1 Jun. 14, 2007

(51) Int. Cl.
*H01L 41/083* (2006.01)
(52) U.S. Cl. .................... 310/328; 310/366
(58) Field of Classification Search ........... 310/328, 310/330, 331, 366
See application file for complete search history.

(56) References Cited

U.S. PATENT DOCUMENTS

| | | | |
|---|---|---|---|
| 5,189,578 A | 2/1993 | Mori et al. | |
| 5,276,573 A | 1/1994 | Harada et al. | |
| 5,282,190 A | 1/1994 | Maruo et al. | |
| 5,745,319 A | 4/1998 | Takekado et al. | |
| 5,757,573 A | 5/1998 | Tokuyama et al. | |
| 5,764,444 A | 6/1998 | Imamura et al. | |
| 5,793,743 A * | 8/1998 | Duerig et al. | 369/126 |
| 5,802,914 A | 9/1998 | Fassler et al. | |
| 5,805,381 A | 9/1998 | Resh | |
| 5,943,189 A | 8/1999 | Boutaghou et al. | |
| 6,188,548 B1 | 2/2001 | Khan et al. | |
| 6,246,552 B1 | 6/2001 | Soeno et al. | |
| 6,268,983 B1 | 7/2001 | Imada et al. | |
| 6,274,966 B1 * | 8/2001 | Kohno et al. | 310/328 |
| 6,275,454 B1 | 8/2001 | Boutaghou | |
| 6,362,933 B1 | 3/2002 | Sampietro et al. | |
| 6,501,625 B1 | 12/2002 | Boismier et al. | |
| 6,545,846 B1 | 4/2003 | Chee et al. | |
| 6,570,730 B1 | 5/2003 | Lewis et al. | |
| 6,590,748 B2 | 7/2003 | Murphy et al. | |
| 6,611,399 B1 | 8/2003 | Mei et al. | |
| 6,747,396 B2 * | 6/2004 | Blom | 310/328 |
| 6,950,266 B1 | 9/2005 | McCaslin et al. | |
| 2003/0193755 A1 * | 10/2003 | Kurihara et al. | 360/294.4 |
| 2004/0256955 A1 * | 12/2004 | Okazawa et al. | 310/328 |
| 2005/0152072 A1 | 7/2005 | Kwon et al. | |

* cited by examiner

*Primary Examiner*—Thomas M. Dougherty
(74) *Attorney, Agent, or Firm*—Earle Jennings GSS Law Group

(57) ABSTRACT

The invention includes a D33 mode piezoelectric actuator region, including electrodes of differing length to produce a bending motion. The invention also includes a piezoelectric actuator containing a first piezoelectric actuator region coupled to a second piezoelectric actuator region, which may be separated by the ceramic material. Applying a first potential difference between electrodes generates a first bending of the piezoelectric actuator region. Applying the negative first potential difference generates the complement first bending for the piezoelectric actuator. The piezoelectric actuator region may be used to radially move a coupled transducer by the first bending. The piezoelectric actuator may be used to radially move a coupled transducer by the first bending and/or its complement. The invention includes the methods of making the piezoelectric actuator region and the piezoelectric actuator, and their products.

16 Claims, 2 Drawing Sheets

METHOD AND APPARATUS FOR A D33 MODE PIEZOELECTRIC ACTUATOR WITH A BENDING MOTION

TECHNICAL FIELD

This invention relates to piezoelectric actuators, in particular, to a D33 mode piezoelectric actuator providing a bending motion.

BACKGROUND OF THE INVENTION

Contemporary piezoelectric actuators are found in two basic configurations, operating in what are commonly known as the D33 and D31 modes. The relative displacement in the D33 mode is about three times greater than in the D31 mode. A D33 mode piezoelectric actuator is typically composed of a stack of piezoelectric components. Displacement in the D33 mode is an expansion in the same direction as both the electric field and the poling direction. D33 mode actuators provide a linear motion. A D31 mode actuator acts by contracting perpendicular to the electric field and the poling direction.

The D33 mode piezoelectric actuators are more commonly seen in industrial applications. They use the expansion of the active material, in D33 mode to produce a displacement. Typically, the active part of these actuators includes a stack of ceramic layers ranging in thickness between 20 to 100 micrometers ($\mu m$), separated by thin, uniformly sized and shaped metallic layers known herein as electrodes. The actuator deformation is often 0.15% (15 $\mu/cm$) of the total unit size.

The D31 mode actuators use the contraction of the active material, in the D31 mode, to produce a negative displacement. The active material of these actuators also includes ceramic layers separated by thin metallic layers. However these D31 mode actuators displace perpendicular to the electric field and the poling direction, with the displacement being a function of the length of the actuator, with the number of parallel layers determining the stiffness of these piezoelectric actuators. These actuators can and do bend, but when short, do not bend very much and may require higher potential differences to achieve these results.

What is needed is a piezoelectric actuator combining the advantages of the D33 mode actuator in terms of displacement and the consequent lower voltage driving requirements, with the flexibility of bending found in the D31 mode piezoelectric actuators.

SUMMARY OF THE INVENTION

The invention includes a D33 mode piezoelectric actuator region, including at least one first electrode separated by a ceramic material from at least one, second electrode. The first electrode terminates at a first wall and has a first length. The second electrode terminates at a second wall and has a second length. The first length is greater than the second length.

The first length may be at least twice the second length. The piezoelectric actuator region may include at least two of the first electrodes and/or at least two of the second electrodes. Each of the first electrodes may be of the first width and each of the second electrodes may be of the second width.

The invention also includes a piezoelectric actuator containing a first piezoelectric actuator region coupled to a second piezoelectric actuator region. The first piezoelectric actuator region coupled to the second piezoelectric actuator region may further include the first and second piezoelectric actuator regions separated by the ceramic material. Several variations in lengths are included in the invention.

Applying a first potential difference between the first electrodes and the second electrodes generates a first bending of the piezoelectric actuator region. Operating the piezoelectric actuator further includes the applying the negative of the first potential difference to generate the complement of the first bending. The operation of the piezoelectric actuator region may be used to radially move a coupled transducer by the first bending. The piezoelectric actuator may be used to radially move a coupled transducer by the first bending and/or its complement. The transducer may interface with data on a rotating disk surface in a hard disk drive. The transducer may include a laser optically interfacing with an optical storage device.

The piezoelectric actuator region is created by making the first electrode(s) and the second electrode(s). Making the piezoelectric actuator includes making the first piezoelectric actuator region and making the second piezoelectric actuator region. The invention includes the piezoelectric actuator region and the piezoelectric actuator as products of these processes.

DETAILED DESCRIPTION

Figure 1A:
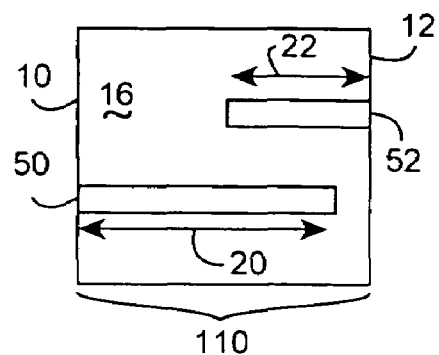
FIGS. 1A to 1C and 2D shows various aspects of the invention's piezoelectric actuator region.
Figure 1B:
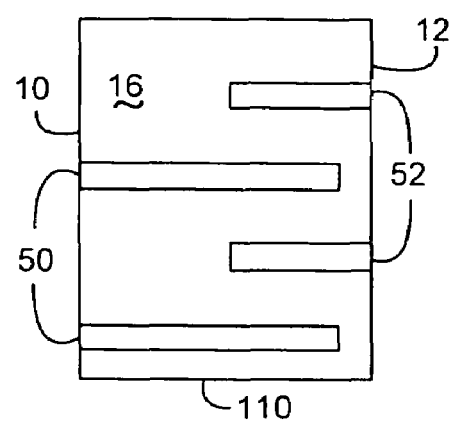
Figure 1C:
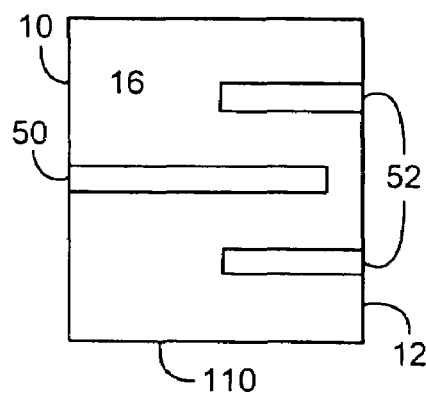

This invention relates to piezoelectric actuators, in particular, to a D33 mode piezoelectric actuator providing a bending motion.

The invention includes a D33 mode piezoelectric actuator region, including at least one first electrode separated by a ceramic material from at least one, second electrode. The first electrode(s) terminate at a first wall and have a first length. The second electrode(s) terminate at a second wall and have a second length. The first length is greater than the second length. The piezoelectric actuator region operates by applying a first potential difference between the first electrodes and the second electrodes to generate a first bending of the piezoelectric actuator region.

The first length may be at least twice the second length. The piezoelectric actuator region may include at least two of the first electrodes and/or at least two of the second electrodes. Each of the first electrodes may be of a first width and each of the second electrodes may be of a second width. The first width may be essentially the same as the second width, which will refer herein to being within five percent of each other.

The D33 mode piezoelectric actuator region 110 shown in FIGS. 1A to 2A, includes at least one first electrode 50 separated by a ceramic material 16 from at least one, second electrode 52. The first electrode(s) terminate at a first wall 10 and have a first length 20. The second electrode(s) terminate at a second wall 12 and have a second length 22. The first length is greater than the second length. The piezoelectric actuator region operates by applying a first potential difference V1 between the first electrodes and the second electrodes to generate a first bending 70 of the piezoelectric actuator region shown in FIG. 2B.

The first length 20 may be at least twice the second length 22. The piezoelectric actuator region 110 may include at least two of the first electrodes 50 and/or at least two of the second electrodes 52. Each of the first electrodes may be of a first width 60 and each of the second electrodes may be of a second width 62 as shown in FIG. 2D. The first width may be essentially the same as the second width.

The invention also includes a piezoelectric actuator containing a first piezoelectric actuator region coupled to a second piezoelectric actuator region. The first piezoelectric actuator region coupled to the second piezoelectric actuator region may further include the first and second piezoelectric actuator regions separated by the ceramic material.

The piezoelectric actuator 100 containing a first piezoelectric actuator region 110 coupled 18 to a second piezoelectric actuator region 120 as shown in FIGS. 1D to 2A. The first piezoelectric actuator region has been discussed above regarding the piezoelectric actuator region 110. The second piezoelectric region includes the following. At least one of the first electrodes 50 terminating at the first wall 10 and of a third length 24. And at least one of the second electrodes 52 terminating at the second wall 12 and of a fourth length 26, where the third length is less than the fourth length.

Figure 1D:
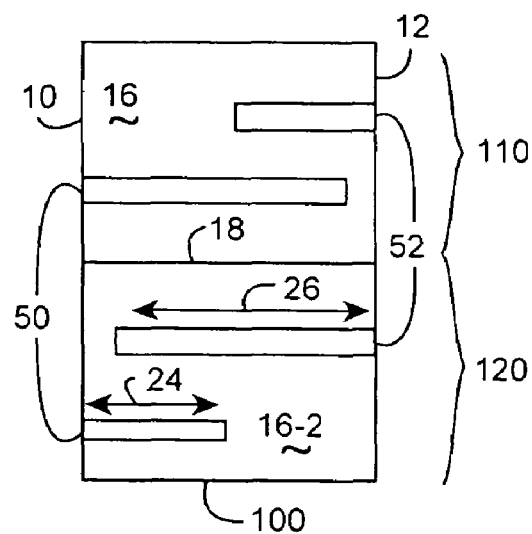
FIGS. 1D to 1F and 2A show various aspects of the invention's piezoelectric actuator including a first piezoelectric actuator region coupled to a second piezoelectric actuator region.
Figure 1E:
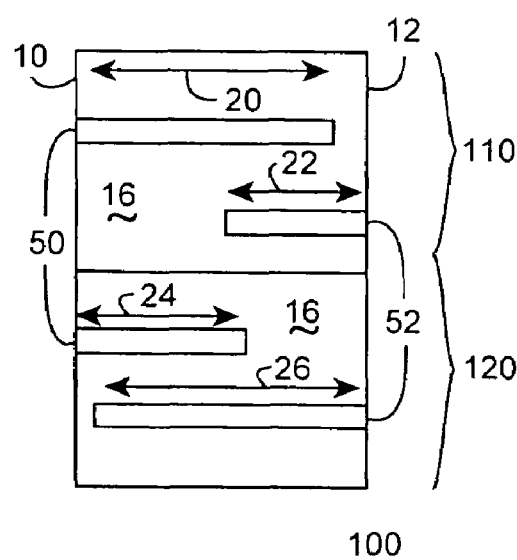
Figure 1F:
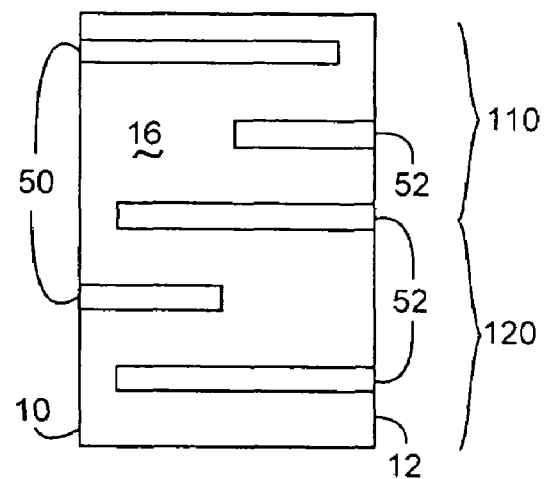
Figure 2A:
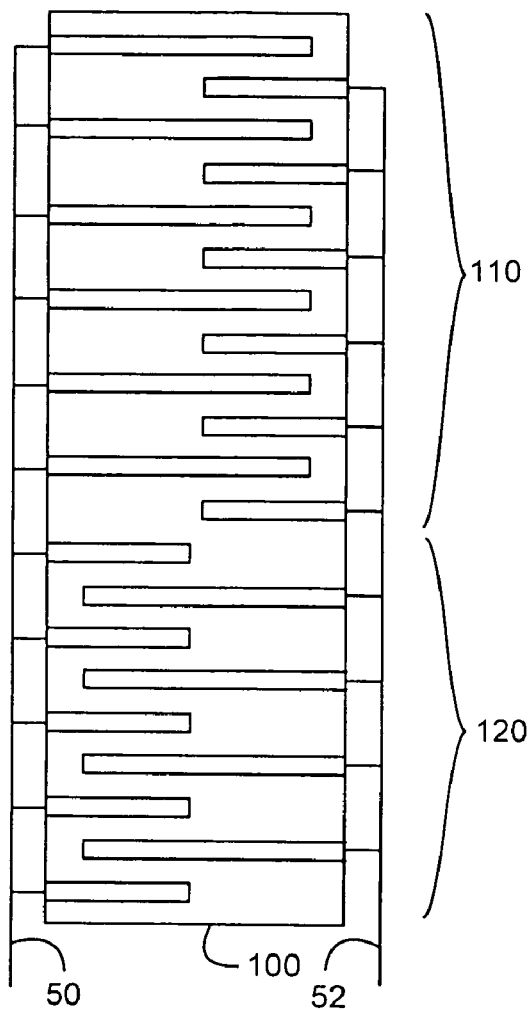

The first piezoelectric actuator region 110 coupled 18 to the second piezoelectric actuator region 120 may further include the first piezoelectric actuator region separated by the ceramic material 16 from the second piezoelectric actuator region as shown in FIGS. 1F and 2A. The second piezoelectric actuator region may use a second ceramic material 16-2, which may differ from the ceramic material used in the first piezoelectric actuator region, as shown in FIG. 1D.

Several variations in lengths are included in the invention. The fourth length 26 may be at least twice the third length 24. The first length 20 may be essentially the same as the fourth length. The second length 22 may be essentially the same as the third length.

The ceramic material 16 and/or the second ceramic material 16-2 may include at least one piezoelectric composite materials, often including lead, zirconium, and tungsten. The piezoelectric effect generates a mechanical action through the application of electric power which will be discussed in terms of applying a potential difference between electrodes.

Applying a first potential difference between the first electrodes and the second electrodes generates a first bending of the piezoelectric actuator region. Operating the piezoelectric actuator further includes the applying the negative of the first potential difference to generate the complement of the first bending. The operation of the piezoelectric actuator region may be used to radially move a coupled transducer by the first bending. The piezoelectric actuator may be used to radially move a coupled transducer by the first bending and/or its complement. The transducer may interface with data on a rotating disk surface in a hard disk drive. The transducer may include a laser optically interfacing with an optical storage device.

Figure 2B:
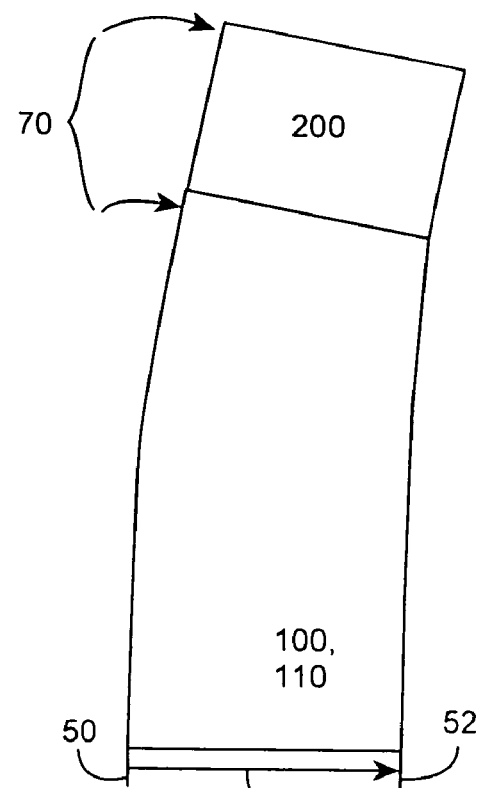
FIG. 2B shows the first bending of the piezoelectric actuator region and the piezoelectric actuator, either of which may be coupled with a transducer.

Applying a first potential difference V1 between the first electrodes 50 and the second electrodes 52 generates a first bending 70 of the piezoelectric actuator region 110 as shown in FIG. 2B. This first bending may be used to radially move a coupled transducer 200.

Figure 2C:
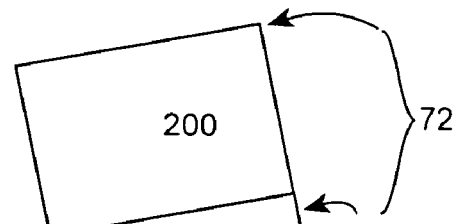
FIG. 2C shows the complement of the first bending of the piezoelectric actuator.
Figure 2D:
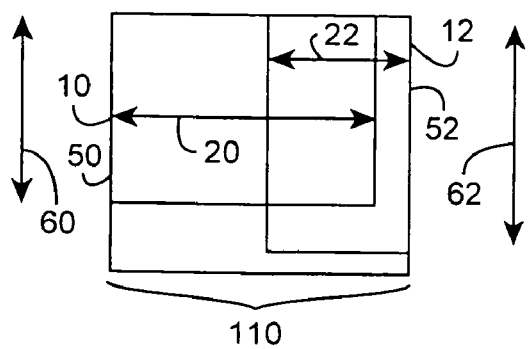

Operating the piezoelectric actuator 100 may include the following steps. Applying a first potential difference V1 between the first electrodes 50 and the second electrodes 52 to generate a first bending 70 of the piezoelectric actuator. Applying the negative of the first potential difference −V1 generate the complement of first bending 72 as shown in FIG. 2C. The angular magnitude of the first bending and the complement of first bending may be essentially the same.

These operations may be used to radially move a coupled transducer 200 by the first bending 70 and/or its complement 72. The transducer may interface with data on a rotating disk surface in a hard disk drive. The transducer may include a laser optically interfacing with an optical storage device. The transducer 200 may be part of a micro-actuator in each head gimbal assembly of the hard disk drive.

The piezoelectric actuator region is produced by making the first electrode(s) and the second electrode(s). Making the piezoelectric actuator includes making the first piezoelectric actuator region and making the second piezoelectric actuator region. The invention includes the piezoelectric actuator region and the piezoelectric actuator as products of these processes.

The piezoelectric actuator region 110 may be made by making the first electrodes 50 terminating at the first wall 10 and of first length 20, and making the second electrodes 52 terminating at the second wall 12 and of second length 22. The invention includes the piezoelectric actuator region as a product of this process.

Making the piezoelectric actuator 100 includes making the first piezoelectric actuator region 110 and making the second piezoelectric actuator region 120. The invention includes the piezoelectric actuator as a product of this process.

As before, first piezoelectric actuator region 110 may be made by making the at least one first electrode 50 terminating at the first wall 10 and of first length 20, and making the at least one second electrode 52 terminating at the second wall 12 and of second length 22.

Making the second piezoelectric actuator region 120 includes making the at least one first electrode 50 terminating at the first wall and of the third length 24, and making the at least one of the second electrode 52 terminating at the second wall and of the fourth length 26.

Numerical simulations were performed on piezoelectric actuator 100 shown in FIG. 2A with the first piezoelectric actuator region 110 including seven second electrodes 52, and the second piezoelectric actuator region 120 including nine second electrodes 52. There were first electrodes between each adjacent second electrodes and at the top and bottom of the piezoelectric actuator 100. The first length 20 was set to 140 micro-meters (µ), the second length 22 set to 118 micro-meters (µ). The first width 60 is 2 micro-meters and the second width is 2 micro-meters. The first potential difference V1 was set to thirty Volts causing the predicted first bending of about 15 micro-meters. The negative first potential difference −V1 was set to minus thirty Volts and the predicted complement of the first bending was about 15 micro-meters.

The preceding embodiments provide examples of the invention and are not meant to constrain the scope of the following claims.

What is claimed is:

1. A piezoelectric actuator, comprising:
   a first of said piezoelectric actuator regions, coupled to a second of said piezoelectric actuator regions;
   wherein each of said piezoelectric actuator regions is a D33 mode piezoelectric device;
   wherein said first piezoelectric actuator region, comprises: at least one first electrode, terminating at a first wall and of a first length, separated by a ceramic material from at least one second electrode, terminating at a second wall and of a second length, whereby said first length is greater than said second length;
   wherein said second piezoelectric actuator region, comprises: at least one of said first electrodes terminating at said first wall and of a third length separated by said ceramic material from at least one of said second electrodes terminating at said second wall and of a fourth length, whereby said third length is less than said fourth length.

2. The piezoelectric actuator of claim 1, wherein said first length is at least twice said second length.

3. The piezoelectric actuator of claim 1, further comprising: at least two of said first electrodes terminating at said first wall and of said first length, separated by a ceramic material from at least one of said second electrode terminating at said second wall and of said second length.

4. The piezoelectric actuator of claim 1, further comprising: at least one of said first electrodes, terminating at said first wall and of said first length, separated by a ceramic material from at least two of said second electrodes terminating at said second wall and of said second length.

5. The piezoelectric actuator of claim 1, wherein each of said first electrodes is of a first width, and each of said second electrodes is of a second width.

6. The piezoelectric actuator of claim 1, wherein said first width is essentially the same as said second width.

7. The piezoelectric actuator of claim 1, wherein said first piezoelectric actuator region coupled to said second piezoelectric actuator region, further comprises: said first piezoelectric actuator region separated by said ceramic material from said second piezoelectric actuator region.

8. The piezoelectric actuator of claim 1, wherein said fourth length is at least twice said third length.

9. The piezoelectric actuator of claim 1, wherein said first length is essentially the same as said fourth length.

10. The piezoelectric actuator of claim 1, wherein said second length is essentially the same as said third length.

11. A method of operating said piezoelectric actuator of claim 1, comprising the steps:
    applying a first potential difference between said first electrodes and said second electrodes to generate a first bending of said piezoelectric actuator; and
    applying the negative of said first potential difference between said first electrodes and said second electrodes to generate the complement of said first bending of said piezoelectric actuator.

12. The method of claim 11, wherein said piezoelectric actuator is coupled to a transducer;
    wherein the step applying said first potential difference, further comprises the step:
    applying said first potential difference between said first electrodes and said second electrode to radially move said transducer by said first bending;
    wherein the step applying said negative of said first potential difference, further comprises the step:
    applying said negative of said first potential difference between said first electrodes and said second electrode to radially move said transducer by said complement of said first bending.

13. The method of claim 12, wherein said transducer interfaces with data on a rotating disk surface in a hard disk drive.

14. The method of claim 12, wherein said transducer, includes: a laser optically interfacing with an optical storage device.

15. A method of making said piezoelectric actuator of claim 1, comprising the steps:
    making said first piezoelectric actuator region, further comprising the steps:
    making said at least one of said first electrode terminating at said first wall and of said first length; and
    making said at least one of said second electrode terminating at said second wall and of said second length; and
    making said second piezoelectric actuator region, further comprising the steps:
    making said at least one of said first electrode terminating at said first wall and of said third length; and
    making said at least one of said second electrode terminating at said second wall and of said fourth length.

16. The piezoelectric actuator, as a product of the process of claim 14.

* * * * *